United States Patent
Xu et al.

(10) Patent No.: US 11,763,769 B2
(45) Date of Patent: Sep. 19, 2023

(54) GOA DEVICE AND GATE DRIVING CIRCUIT

(71) Applicant: Shenzhen China Star Optoelectronics Semiconductor Display Technology Co., Ltd., Guangdong (CN)

(72) Inventors: Zhida Xu, Guangdong (CN); Xiaohui Yao, Guangdong (CN); Ilgon Kim, Guangdong (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 472 days.

(21) Appl. No.: 17/042,964

(22) PCT Filed: Jun. 5, 2020

(86) PCT No.: PCT/CN2020/094713
§ 371 (c)(1),
(2) Date: Sep. 29, 2020

(87) PCT Pub. No.: WO2021/227161
PCT Pub. Date: Nov. 18, 2021

(65) Prior Publication Data
US 2023/0119817 A1    Apr. 20, 2023

(30) Foreign Application Priority Data
May 13, 2020 (CN) .......................... 202010403135.8

(51) Int. Cl.
*G09G 3/36* (2006.01)
(52) U.S. Cl.
CPC .... *G09G 3/3677* (2013.01); *G09G 2300/0408* (2013.01); *G09G 2310/0286* (2013.01)
(58) Field of Classification Search
None
See application file for complete search history.

(56) References Cited

U.S. PATENT DOCUMENTS

2011/0150169 A1    6/2011    Lin et al.

FOREIGN PATENT DOCUMENTS

| CN | 104505049 | | 4/2015 | |
| --- | --- | --- | --- | --- |
| CN | 107799087 | | 3/2018 | |
| CN | 109410886 | | 3/2019 | |
| CN | 108637423 | * | 4/2019 | ............... G09G 3/20 |
| CN | 109637423 | * | 4/2019 | ............... G09G 3/20 |
| CN | 111028755 | | 4/2020 | |

* cited by examiner

*Primary Examiner* — Ifedayo B Iluyomade

(57) ABSTRACT

The present application provides a GOA device and a gate driving circuit. The GOA device includes a pull-up control circuit, a bootstrap capacitor, a pull-up circuit, a pull-down circuit, and a pull-down holding circuit. The present application decreases a number of TFTs of the gate driving circuit and simplifies a structure of the gate driving circuit by multiplexing the bootstrap capacitor, the pull-down circuit, and the pull-down holding circuit.

18 Claims, 1 Drawing Sheet

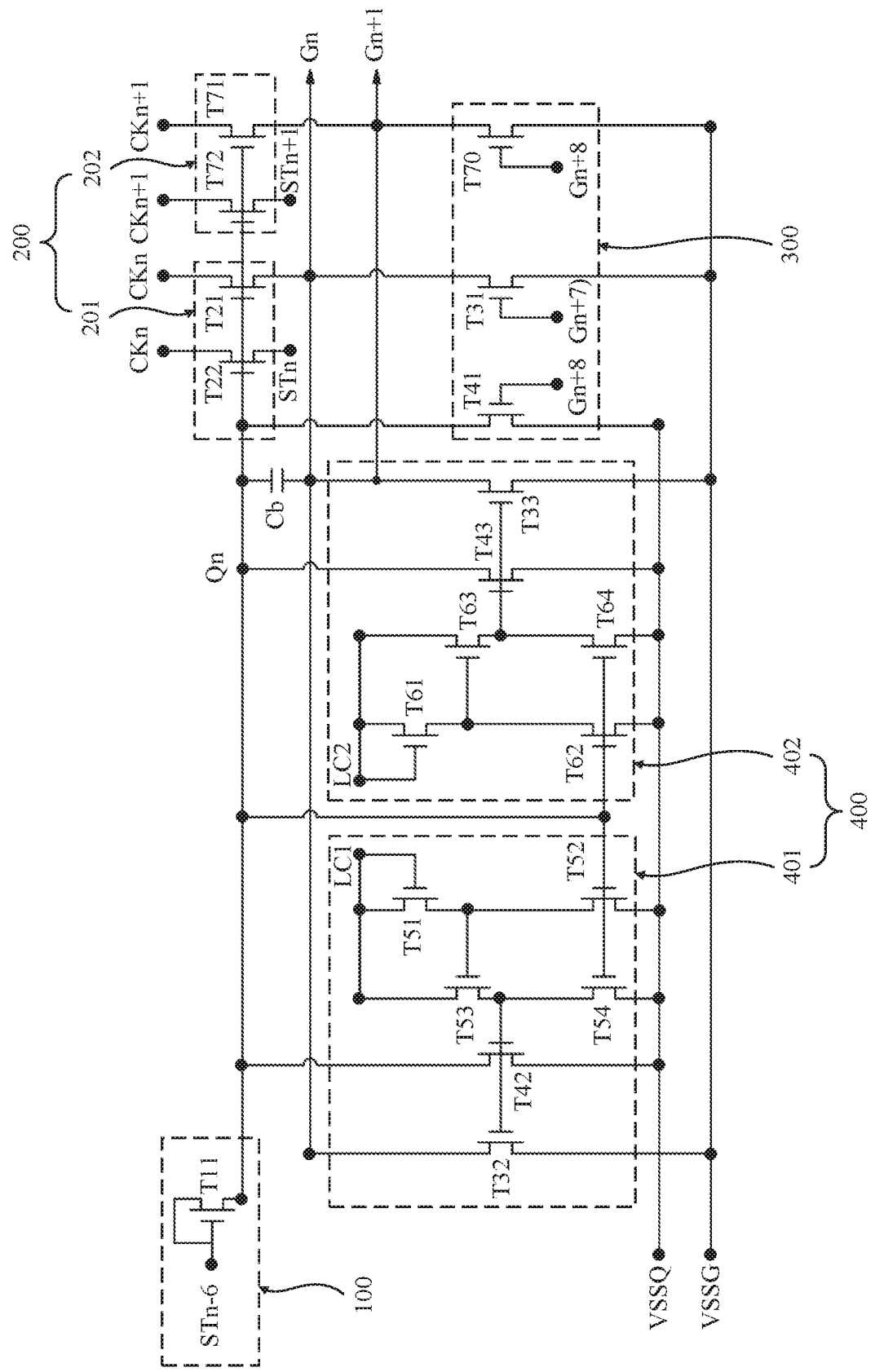

US 11,763,769 B2

GOA DEVICE AND GATE DRIVING CIRCUIT

RELATED APPLICATIONS

This application is a National Phase of PCT Patent Application No. PCT/CN2020/094713 having International filing date of Jun. 5, 2020, which claims the benefit of priority of Chinese Patent Application No. 202010403135.8 filed on May 13, 2020. The contents of the above applications are all incorporated by reference as if fully set forth herein in their entirety.

FIELD AND BACKGROUND OF THE INVENTION

The present invention relates to the technical field of display, particularly a gate on array (GOA) device and a gate driving circuit.

Gate on array (GOA) technique integrates a scan line driving circuit on an array substrate of a liquid crystal display (LCD) panel to reduce product cost in terms of material cost and manufacturing process.

With development of technology in the display industry, users have increasing demand on exterior designs of display panels, such as a design of narrow bezels. A gate driving circuit is arranged at a border area of the display panel, the gate driving circuit includes N stages of GOA units, and any one of the GOA units is provided with a plurality of thin-film transistors so that the border area cannot be further reduced.

There is an urgent need of a gate driving circuit to solve these technical problems.

SUMMARY OF THE INVENTION

The present application provides a gate on array (GOA) device and a gate driving circuit to solve a technical problem of complex structure of gate driving circuit in existing display panels in the prior art.

The present application provides a gate on array (GOA) device, including at least two cascaded GOA circuits, an $N^{th}$ stage GOA circuit configured to output a gate driving signal to an $N^{th}$ scan line, the $N^{th}$ stage GOA circuit includes a pull-up control circuit, a bootstrap capacitor, a pull-up circuit, a pull-down circuit, and a pull-down holding circuit.

The pull-up control circuit receives a start signal to pull-up a potential of a control node (Qn) of the $N^{th}$ stage GOA circuit and a potential of a control node (Qn) of an $(N+1)^{th}$ stage GOA circuit to a first high potential to charge a bootstrap capacitor during a first time period.

The bootstrap capacitor holds the potential of the control node (Qn) of the $N^{th}$ stage GOA circuit and the potential of the control node (Qn) of the $(N+1)^{th}$ stage GOA circuit at the first high potential during a second time period.

The pull-up circuit outputs the gate driving signal to a gate signal end (Gn) of the $N^{th}$ stage GOA circuit according to a first clock signal and the first high potential applied on the control node (Qn) of the $N^{th}$ stage GOA circuit, and outputs the gate driving signal to a gate signal end (Gn+1) of the $(N+1)^{th}$ stage GOA circuit according to a second clock signal and the first high potential applied on the control node (Qn) of the $(N+1)^{th}$ stage GOA circuit.

The pull-down circuit pulls the potential of the control node (Qn) of the $N^{th}$ stage GOA circuit and the potential of the control node (Qn) of the $(N+1)^{th}$ stage GOA circuit to a first direct current (DC) low level, pulls a potential of the gate signal end (Gn) of the $N^{th}$ stage GOA circuit to a second DC low level, and pulls a potential of the gate signal end (Gn+1) of the $(N+1)^{th}$ stage GOA circuit to the second DC low level during a third time period.

The pull-down holding circuit holds the potential of the control node (Qn) of the $N^{th}$ stage GOA circuit and the potential of the control node (Qn) of the $(N+1)^{th}$ stage GOA circuit at the first DC low level, and holds the potential of the gate signal end (Gn) of the $N^{th}$ stage GOA circuit and the potential of the gate signal end (Gn+1) of the $(N+1)^{th}$ stage GOA circuit at the second DC low level during a fourth time period.

In the GOA device of the present application, the pull-up control circuit is connected to a cascaded signal end (STn−6) of an $(N-6)^{th}$ stage GOA circuit, the control node (Qn) of the $N^{th}$ stage GOA circuit and the control node (Qn) of the $(N+1)^{th}$ stage GOA circuit.

During the first time period, the pull-up control circuit receives the start signal from the cascaded signal end (STn−6) of the $(N-6)^{th}$ stage GOA circuit, and receives the start signal according to the cascaded signal end (STn−6) of the $(N-6)^{th}$ stage GOA circuit to pull the potential of the control node (Qn) of the $N^{th}$ stage GOA circuit and the potential of the control node (Qn) of the $(N+1)^{th}$ stage GOA circuit to the first high potential.

In the GOA device of the present application, the pull-up control circuit includes an eleventh thin film transistor (TFT) (T11).

A gate and a source of the eleventh TFT (T11) are connected to the cascaded signal end (STn−6) of the $(N-6)^{th}$ stage GOA circuit, a drain of the eleventh TFT (T11) is connected to the control node (Qn) of the $N^{th}$ stage GOA circuit and the control node (Qn) of the $(N+1)^{th}$ stage GOA circuit.

In the GOA device of the present application, the bootstrap capacitor is connected to the control node (Qn) of the $N^{th}$ stage GOA circuit, the control node (Qn) of the $(N+1)^{th}$ stage GOA circuit, the gate signal end (Gn) of the $N^{th}$ stage GOA circuit, the gate signal end (Gn+1) of the $(N+1)^{th}$ stage GOA circuit, the pull-down holding circuit, and the pull-up circuit.

A first end of the bootstrap capacitor is connected to the control node (Qn) of the $N^{th}$ stage GOA circuit, the control node (Qn) of the $(N+1)^{th}$ stage GOA circuit, and the pull-up circuit, a second end of the bootstrap capacitor is connected to the gate signal end (Gn) of the $N^{th}$ stage GOA circuit, the gate signal end (Gn+1) of the $(N+1)^{th}$ stage GOA circuit, and the pull-down holding circuit.

In the GOA device of the present application, the pull-up circuit includes a first pull-up sub-circuit and a second pull-up sub-circuit.

The first pull-up sub-circuit is connected to the control node (Qn) of the $N^{th}$ stage GOA circuit, a first clock signal end (CKn), a cascaded signal end (STn) of the $N^{th}$ stage GOA circuit, and the gate signal end (Gn) of the $N^{th}$ stage GOA circuit.

The second pull-up sub-circuit is connected to the control node (Qn) of the $(N+1)^{th}$ stage GOA circuit, a second clock signal end (CKn+1), a cascaded signal end (STn+1) of the $(N+1)^{th}$ stage GOA circuit, and the gate signal end (Gn+1) of the $(N+1)^{th}$ stage GOA circuit.

The first clock signal end (CKn) is configured to output the first clock signal, the second clock signal end (CKn+1) is configured to output the second clock signal.

The control node (Qn) of the $N^{th}$ stage GOA circuit and the control node (Qn) of the $(N+1)^{th}$ stage GOA circuit control TFT in the pull-up circuit to turn on and turn off.

In the GOA device of the present application, the first pull-up sub-circuit includes a twenty first TFT (T21) and a twenty second TFT (T22).

A gate of the twenty first TFT (T21) is connected to the control node (Qn) of the $N^{th}$ stage GOA circuit, a source of the twenty first TFT (T21) is connected to the first clock signal end (CKn), a drain of the twenty first TFT (T21) is connected to the gate signal end (Gn) of the $N^{th}$ stage GOA circuit.

A gate of the twenty second TFT (T22) is connected to the control node (Qn) of the $N^{th}$ stage GOA circuit, a source of the twenty second TFT (T22) is connected to the first clock signal end (CKn), a drain of the twenty second TFT (T22) is connected to the cascaded signal end (STn) of the $N^{th}$ stage GOA circuit.

The second pull-up sub-circuit includes a seventy first TFT (T71) and a seventy second TFT (T72).

A gate of the seventy first TFT (T71) is connected to the control node (Qn) of the $(N+1)^{th}$ stage GOA circuit, a source of the seventy first TFT (T71) is connected to the second clock signal end (CKn+1), a drain of the seventy first TFT (T71) is connected to the gate signal end (Gn+1) of the $(N+1)^{th}$ stage GOA circuit.

A gate of the seventy second TFT (T72) is connected to the control node (Qn) of the $(N+1)^{th}$ stage GOA circuit, a source of the seventy second TFT (T72) is connected to the second clock signal end (CKn+1), a drain of the seventy second TFT (T72) is connected to the cascaded signal end (STn+1) of the $(N+1)^{th}$ stage GOA circuit.

In the GOA device of the present application, the pull-down circuit is connected to the control node (Qn) of the $N^{th}$ stage GOA circuit, the control node (Qn) of the $(N+1)^{th}$ stage GOA circuit, the gate signal end (Gn) of the $N^{th}$ stage GOA circuit, the gate signal end (Gn+1) of the $(N+1)^{th}$ stage GOA circuit, a gate signal end (Gn+7) of an $(N+7)^{th}$ stage GOA circuit, a gate signal end (Gn+8) of an $(N+8)^{th}$ stage GOA circuit, a first DC low level end (VSSQ), and a second DC low level end (VSSG).

The first DC low level end (VSSQ) outputs the first DC low level, the second DC low level end (VSSG) outputs the second DC low level.

The third time period starts when the gate signal end (Gn+7) of the $(N+7)^{th}$ stage GOA circuit and the gate signal end (Gn+8) of the $(N+8)^{th}$ stage GOA circuit are at high potential.

In the GOA device of the present application, the pull-down circuit includes a thirty first TFT (T31), a forty first TFT (T41), and a seventy TFT (T70).

A source of the thirty first TFT (T31) is connected to the gate signal end (Gn) of the $N^{th}$ stage GOA circuit, a source of the seventy TFT (T70) is connected to the gate signal end (Gn+1) of the $(N+1)^{th}$ stage GOA circuit, a source of the forty first TFT (T41) is connected to the control node (Qn) of the $N^{th}$ stage GOA circuit and the control node (Qn) of the $(N+1)^{th}$ stage GOA circuit.

A drain of the thirty first TFT (T31) is connected to the second DC low level end (VSSG), a drain of the seventy TFT (T70) is connected to the second DC low level end (VSSG), a drain of the forty first TFT (T41) is connected to the first DC low level end (VSSQ).

A gate of the thirty first TFT (T31) is connected to the gate signal end (Gn+7) of the $(N+7)^{th}$ stage GOA circuit, a gate of the forty first TFT (T41) is connected to the gate signal end (Gn+8) of the $(N+8)^{th}$ stage GOA circuit, a gate of the seventy TFT (T70) is connected to the gate signal end (Gn+8) of the $(N+8)^{th}$ stage GOA circuit.

In the GOA device of the present application, the pull-down holding circuit includes a first pull-down holding sub-circuit and a second pull-down holding sub-circuit.

The first pull-down holding sub-circuit is connected to a high voltage signal, the control node (Qn) of the $N^{th}$ stage GOA circuit, the control node (Qn) of the $(N+1)^{th}$ stage GOA circuit, the gate signal end (Gn) of the $N^{th}$ stage GOA circuit, a first DC low level end (VSSQ), and a second DC low level end (VSSG).

The second pull-down holding sub-circuit is connected to a second high voltage signal, the control node (Qn) of the $N^{th}$ stage GOA circuit, the control node (Qn) of the $(N+1)^{th}$ stage GOA circuit, the gate signal end (Gn+1) of the $(N+1)^{th}$ stage GOA circuit, the first DC low level end (VSSQ), and the second DC low level end (VSSG).

In the GOA device of the present application, the first high voltage signal is output by a first high voltage signal end LC1, the second high voltage signal is output by the second high voltage signal LC2.

The first high voltage signal and the second high voltage signal are 200 times of a frame period, the first high voltage signal and the second high voltage signal are low frequency signal with 50% duty ratio, a phase difference between the first high voltage signal and the second high voltage signal is ½.

The present application further provides a gate driving circuit which includes the GOA device.

The GOA device includes at least two cascaded GOA circuits, an $N^{th}$ stage GOA circuit configured to output a gate driving signal to an $N^{th}$ scan line, wherein the $N^{th}$ stage GOA circuit comprises a pull-up control circuit, a bootstrap capacitor, a pull-up circuit, a pull-down circuit, and a pull-down holding circuit.

The pull-up control circuit receives a start signal to pull-up a potential of a control node (Qn) of the $N^{th}$ stage GOA circuit and a potential of a control node (Qn) of the $(N+1)^{th}$ stage GOA circuit to a first high potential so that the bootstrap capacitor can be charged during a first time period.

The bootstrap capacitor holds the potential of the control node (Qn) of the $N^{th}$ stage GOA circuit and the potential of the control node (Qn) of an $(N+1)^{th}$ stage GOA circuit at the first high potential during a second time period.

The pull-up circuit outputs the gate driving signal to a gate signal end (Gn) of the $N^{th}$ stage GOA circuit according to a first clock signal and the first high potential of the control node (Qn) of the $N^{th}$ stage GOA circuit, and the pull-up circuit outputs the gate driving signal to a gate signal end (Gn+1) of the $(N+1)^{th}$ stage GOA circuit according to a second clock signal and the first high potential of the control node (Qn) of the $(N+1)^{th}$ stage GOA circuit.

The pull-down circuit pulls the potential of the control node (Qn) of the $N^{th}$ stage GOA circuit and the potential of the control node (Qn) of the $(N+1)^{th}$ stage GOA circuit to a first direct current (DC) low level, pulls a potential of the gate signal end (Gn) of the $N^{th}$ stage GOA circuit to a second DC low level, and pulls a potential of the gate signal end (Gn+1) of the $(N+1)^{th}$ stage GOA circuit to the second DC low level during a third time period.

The pull-down holding circuit holds the potential of the control node (Qn) of the $N^{th}$ stage GOA circuit and the potential of the control node (Qn) of the $(N+1)^{th}$ stage GOA circuit at the first DC low level, and holds the potential of the gate signal end (Gn) of the $N^{th}$ stage GOA circuit and the potential of the gate signal end (Gn+1) of the $(N+1)^{th}$ stage GOA circuit at the second DC low level during a fourth time period.

In the gate driving circuit of the present application, the pull-up control circuit is connected to a cascaded signal end (STn−6) of an (N−6)$^{th}$ stage GOA circuit, the control node (Qn) of the N$^{th}$ stage GOA circuit and the control node (Qn) of the (N+1)$^{th}$ stage GOA circuit.

During the first time period, the pull-up control circuit receives the start signal from the cascaded signal end (STn−6) of the (N−6)$^{th}$ stage GOA circuit, and receives the start signal according to the cascaded signal end (STn−6) of the (N−6)$^{th}$ stage GOA circuit to pull the potential of the control node (Qn) of the N$^{th}$ stage GOA circuit and the potential of the control node (Qn) of the (N+1)$^{th}$ stage GOA circuit to the first high potential.

In the gate driving circuit of the present application, the pull-up control circuit includes an eleventh thin film transistor (TFT) (T11), a gate and a source of the eleventh TFT (T11) are connected to the cascaded signal end (STn−6) of the (N−6)$^{th}$ stage GOA circuit, a drain of the eleventh TFT (T11) is connected to the control node (Qn) of the N$^{th}$ stage GOA circuit and the control node (Qn) of the (N+1)$^{th}$ stage GOA circuit.

In the gate driving circuit of the present application, the bootstrap capacitor is connected to the control node (Qn) of the N$^{th}$ stage GOA circuit, the control node (Qn) of the (N+1)$^{th}$ stage GOA circuit, the gate signal end (Gn) of the N$^{th}$ stage GOA circuit, the gate signal end (Gn+1) of the (N+1)$^{th}$ stage GOA circuit, the pull-down holding circuit, and the pull-up circuit.

A first end of the bootstrap capacitor is connected to the control node (Qn) of the N$^{th}$ stage GOA circuit, the control node (Qn) of the (N+1)$^{th}$ stage GOA circuit, and the pull-up circuit, a second end of the bootstrap capacitor is connected to the gate signal end (Gn) of the N$^{th}$ stage GOA circuit, the gate signal end (Gn+1) of the (N+1)$^{th}$ stage GOA circuit, and the pull-down holding circuit.

In the gate driving circuit of the present application, the pull-up circuit includes a first pull-up sub-circuit and a second pull-up sub-circuit.

The first pull-up sub-circuit is connected to the control node (Qn) of the N$^{th}$ stage GOA circuit, a first clock signal end (CKn), a cascaded signal end (STn) of the N$^{th}$ stage GOA circuit, and the gate signal end (Gn) of the N$^{th}$ stage GOA circuit.

The second pull-up sub-circuit is connected to the control node (Qn) of the (N+1)$^{th}$ stage GOA circuit, a second clock signal end (CKn+1), a cascaded signal end (STn+1) of the (N+1)$^{th}$ stage GOA circuit, and the gate signal end (Gn+1) of the (N+1)$^{th}$ stage GOA circuit.

The first clock signal end (CKn) is configured to output the first clock signal, the second clock signal end (CKn+1) is configured to output the second clock signal.

The control node (Qn) of the N$^{th}$ stage GOA circuit and the control node (Qn) of the (N+1)$^{th}$ stage GOA circuit control TFT in the pull-up circuit to turn on and turn off.

In the gate driving circuit of the present application, the first pull-up sub-circuit includes a twenty first TFT (T21) and a twenty second TFT (T22).

A gate of the twenty first TFT (T21) is connected to the control node (Qn) of the N$^{th}$ stage GOA circuit, a source of the twenty first TFT (T21) is connected to the first clock signal end (CKn), a drain of the twenty first TFT (T21) is connected to the gate signal end (Gn) of the N$^{th}$ stage GOA circuit.

A gate of the twenty second TFT (T22) is connected to the control node (Qn) of the N$^{th}$ stage GOA circuit, a source of the twenty second TFT (T22) is connected to the first clock signal end (CKn), a drain of the twenty second TFT (T22) is connected to the cascaded signal end (STn) of the N$^{th}$ stage GOA circuit.

The second pull-up sub-circuit comprises a seventy first TFT (T71) and a seventy second TFT (T72).

A gate of the seventy first TFT (T71) is connected to the control node (Qn) of the (N+1)$^{th}$ stage GOA circuit, a source of the seventy first TFT (T71) is connected to the second clock signal end (CKn+1), a drain of the seventy first TFT (T71) is connected to the gate signal end (Gn+1) of the (N+1)$^{th}$ stage GOA circuit.

A gate of the seventy second TFT (T72) is connected to the control node (Qn) of the (N+1)$^{th}$ stage GOA circuit, a source of the seventy second TFT (T72) is connected to the second clock signal end (CKn+1), a drain of the seventy second TFT (T72) is connected to the cascaded signal end (STn+1) of the (N+1)$^{th}$ stage GOA circuit.

In the gate driving circuit of the present application, the pull-down circuit is connected to the control node (Qn) of the N$^{th}$ stage GOA circuit, the control node (Qn) of the (N+1)$^{th}$ stage GOA circuit, the gate signal end (Gn) of the N$^{th}$ stage GOA circuit, the gate signal end (Gn+1) of the (N+1)$^{th}$ stage GOA circuit, a gate signal end (Gn+7) of an (N+7)$^{th}$ stage GOA circuit, a gate signal end (Gn+8) of an (N+8)$^{th}$ stage GOA circuit, a first DC low level end (VSSQ), and a second DC low level end (VSSG).

The first DC low level end (VSSQ) outputs the first DC low level, the second DC low level end (VSSG) outputs the second DC low level.

The third time period starts when the gate signal end (Gn+7) of the (N+7)$^{th}$ stage GOA circuit and the gate signal end (Gn+8) of the (N+8)$^{th}$ stage GOA circuit are at high potential.

In the gate driving circuit of the present application, the pull-down circuit includes a thirty first TFT (T31), a forty first TFT (T41), and a seventy TFT (T70).

A source of the thirty first TFT (T31) is connected to the gate signal end (Gn) of the N$^{th}$ stage GOA circuit, a source of the seventy TFT (T70) is connected to the gate signal end (Gn+1) of the (N+1)$^{th}$ stage GOA circuit, a source of the forty first TFT (T41) is connected to the control node (Qn) of the N$^{th}$ stage GOA circuit and the control node (Qn) of the (N+1)$^{th}$ stage GOA circuit.

A drain of the thirty first TFT (T31) is connected to the second DC low level end (VSSG), a drain of the seventy TFT (T70) is connected to the second DC low level end (VSSG), a drain of the forty first TFT (T41) is connected to the first DC low level end (VSSQ).

A gate of the thirty first TFT (T31) is connected to the gate signal end (Gn+7) of the (N+7)$^{th}$ stage GOA circuit, a gate of the forty first TFT (T41) is connected to the gate signal end (Gn+8) of the (N+8)$^{th}$ stage GOA circuit, a gate of the seventy TFT (T70) is connected to the gate signal end (Gn+8) of the (N+8)$^{th}$ stage GOA circuit.

In the gate driving circuit of the present application, the pull-down holding circuit includes a first pull-down holding sub-circuit and a second pull-down holding sub-circuit.

The first pull-down holding sub-circuit is connected to a high voltage signal, the control node (Qn) of the N$^{th}$ stage GOA circuit, the control node (Qn) of the (N+1)$^{th}$ stage GOA circuit, the gate signal end (Gn) of the N$^{th}$ stage GOA circuit, a first DC low level end (VSSQ), and a second DC low level end (VSSG).

The second pull-down holding sub-circuit is connected to a second high voltage signal, the control node (Qn) of the N$^{th}$ stage GOA circuit, the control node (Qn) of the (N+1)$^{th}$ stage GOA circuit, the gate signal end (Gn+1) of the (N+1)$^{th}$ stage GOA circuit, the first DC low level end (VSSQ), and the second DC low level end (VSSG).

In the gate driving circuit of the present application, the first high voltage signal is output by a first high voltage signal end LC1, the second high voltage signal is output by the second high voltage signal LC2.

The first high voltage signal and the second high voltage signal are 200 times of a frame period, the first high voltage signal and the second high voltage signal are low frequency signal with 50% duty ratio, a phase difference between the first high voltage signal and the second high voltage signal is ½.

The present application decreases a number of thin film transistors of a gate driving circuit and simplifies a structure of the gate driving circuit by multiplexing a bootstrap capacitor, a pull-down circuit, and a pull-down holding circuit so that a gate driving signal of an $N^{th}$ stage GOA circuit and a gate driving signal of an $(N+1)^{th}$ stage GOA circuit in one stage GOA circuit are output at a same time.

BRIEF DESCRIPTION OF THE SEVERAL VIEWS OF THE DRAWINGS

FIG. 1 is a structural diagram of a display panel according to the present application.

DESCRIPTION OF SPECIFIC EMBODIMENTS OF THE INVENTION

The following embodiments refer to the accompanying drawing for exemplifying specific implementable embodiments of the present disclosure. It shall be noted that the described embodiments are used to describe and understand the present disclosure, but the present disclosure is not limited thereto.

With development of technology in the display industry, users have increasing demand on exterior designs of display panels, such as a design of narrow bezels. A gate driving circuit is arranged at a border area of the display panel, the gate driving circuit includes N stages of GOA units, and any one of the GOA units is provided with a plurality of thin-film transistors so that the border area cannot be further reduced. Based on the technical problem, the present application provides technical solutions as follows.

Please refer to FIG. 1, the present application provides a gate on array (GOA) device which includes at least two cascaded GOA circuits, an $N^{th}$ stage GOA circuit configured to output a gate driving signal to an $N^{th}$ scan line. Wherein, the $N^{th}$ stage GOA circuit includes a pull-up control circuit 100, a bootstrap capacitor Cb, a pull-up circuit 200, a pull-down circuit 300, and a pull-down holding circuit 400.

The pull-up control circuit 100 receives a start signal to pull-up a potential of a control node (Qn) of the $N^{th}$ stage GOA circuit and a potential of a control node (Qn) of an $(N+1)^{th}$ stage GOA circuit to a first high potential to charge a bootstrap capacitor Cb during a first time period.

The bootstrap capacitor Cb holds the potential of the control node (Qn) of the $N^{th}$ stage GOA circuit and the potential of the control node (Qn) of the $(N+1)^{th}$ stage GOA circuit at the first high potential during a second time period.

The pull-up circuit 200 outputs the gate driving signal to a gate signal end (Gn) of the $N^{th}$ stage GOA circuit according to a first clock signal and the first high potential applied on the control node (Qn) of the $N^{th}$ stage GOA circuit, and the pull-up circuit 200 outputs the gate driving signal to a gate signal end (Gn+1) of the $(N+1)^{th}$ stage GOA circuit according to a second clock signal and the first high potential applied on the control node (Qn) of the $(N+1)^{th}$ stage GOA circuit.

The pull-down circuit 300 pulls the potential of the control node (Qn) of the $N^{th}$ stage GOA circuit and the potential of the control node (Qn) of the $(N+1)^{th}$ stage GOA circuit to a first direct current (DC) low level, pulls a potential of the gate signal end (Gn) of the $N^{th}$ stage GOA circuit to a second DC low level, and pulls a potential of the gate signal end (Gn+1) of the $(N+1)^{th}$ stage GOA circuit to the second DC low level during a third time period.

The pull-down holding circuit 400 holds the potential of the control node (Qn) of the $N^{th}$ stage GOA circuit and the potential of the control node (Qn) of the $(N+1)^{th}$ stage GOA circuit at the first DC low level, and holds the potential of the gate signal end (Gn) of the $N^{th}$ stage GOA circuit and the potential of the gate signal end (Gn+1) of the $(N+1)^{th}$ stage GOA circuit at the second DC low level during a fourth time period.

The present application decreases the number of thin film transistors of the gate driving circuit and simplifies the structure of the gate driving circuit by multiplexing the bootstrap capacitor Cb, the pull-down circuit 300, and a pull-down holding circuit 400 so that a gate driving signal of $N^{th}$ stage GOA circuit and a gate driving signal of $(N+1)^{th}$ stage GOA circuit in one stage GOA circuit are output at the same time.

The technical solution of the present application will now be described with reference to specific embodiments.

Please refer to FIG. 1, the pull-up control circuit 100 receives the start signal to pull-up the potential of the control node (Qn) of the $N^{th}$ stage GOA circuit and the potential of the control node (Qn) of the $(N+1)^{th}$ stage GOA circuit to the first high potential to charge the bootstrap capacitor Cb during the first time period.

In this embodiment, the pull-up control circuit 100 is connected to a cascaded signal end (STn-6) of an $(N-6)^{th}$ stage GOA circuit, the control node (Qn) of the $N^{th}$ stage GOA circuit, and the control node (Qn) of the $(N+1)^{th}$ stage GOA circuit. The start signal is transmitted from the cascaded signal end (STn-6) of the $(N-6)^{th}$ stage GOA circuit.

During the first time period, the pull-up control circuit 100 receives the start signal from the cascaded signal end (STn-6) of the $(N-6)^{th}$ stage GOA circuit, and receives the start signal according to the cascaded signal end (STn-6) of the $(N-6)^{th}$ stage GOA circuit to pull the potential of the control node (Qn) of the $N^{th}$ stage GOA circuit and the potential of the control node (Qn) of the $(N+1)^{th}$ stage GOA circuit to the first high potential.

In this embodiment, the pull-up control circuit 100 includes an eleventh thin film transistor (TFT) (T11).

A gate and a source of the eleventh TFT (T11) are connected to the cascaded signal end (STn-6) of the $(N-6)^{th}$ stage GOA circuit, and a drain of the eleventh TFT (T11) is connected to the control node (Qn) of the $N^{th}$ stage GOA circuit and the control node (Qn) of the $(N+1)^{th}$ stage GOA circuit. The eleventh TFT (T11) receives the start signal from the cascaded signal end (STn-6) of the $(N-6)^{th}$ stage GOA circuit to turn on the eleventh TFT (T11). The drain of the eleventh TFT (T11) transmits the start signal, transmitted from the cascaded signal end (STn-6) of the $(N-6)^{th}$ stage GOA circuit, to the control node (Qn) of the $N^{th}$ stage GOA circuit so that the potential of the control node (Qn) of the $N^{th}$ stage GOA circuit and the potential of the control node (Qn) of the $(N+1)^{th}$ stage GOA circuit are at the first high potential.

In this embodiment, the $N^{th}$ stage GOA circuit and the $(N+1)^{th}$ stage GOA circuit are connected to the same control node (Qn).

Please refer to FIG. 1, the bootstrap capacitor Cb holds the potential of the control node (Qn) of the $N^{th}$ stage GOA circuit and the potential of the control node (Qn) of the $(N+1)^{th}$ stage GOA circuit at the first high potential during a second time period.

In this embodiment, the bootstrap capacitor Cb is connected to the control node (Qn) of the $N^{th}$ stage GOA circuit, the control node (Qn) of the $(N+1)^{th}$ stage GOA circuit, the gate signal end (Gn) of the $N^{th}$ stage GOA circuit, the gate signal end (Gn+1) of the $(N+1)^{th}$ stage GOA circuit, the pull-down holding circuit 400, and the pull-up circuit 200.

A first end of the bootstrap capacitor Cb is connected to the control node (Qn) of the $N^{th}$ stage GOA circuit, the control node (Qn) of the $(N+1)^{th}$ stage GOA circuit, and the pull-up circuit 200, a second end of the bootstrap capacitor Cb is connected to the gate signal end (Gn) of the $N^{th}$ stage GOA circuit, the gate signal end (Gn+1) of the $(N+1)^{th}$ stage GOA circuit, and the pull-down holding circuit 400.

During the second time period, the eleventh TFT (T11) is turned off, and the cascaded signal end (STn−6) of the $(N-6)^{th}$ stage GOA circuit is not able to transmit the start signal to hold the first high potential of the control node (Qn) of the $N^{th}$ stage GOA circuit and the first high potential of the control node (Qn) of the $(N+1)^{th}$ stage GOA circuit.

In this embodiment, the pull-up circuit 200 outputs the gate driving signal to the gate signal end (Gn) of the $N^{th}$ stage GOA circuit according to a first clock signal and the first high potential applied on the control node (Qn) of the $N^{th}$ stage GOA circuit. The pull-up circuit 200 outputs the gate driving signal to the gate signal end (Gn+1) of the $(N+1)^{th}$ stage GOA circuit according to the second clock signal and the first high potential applied on the control node (Qn) of the $(N+1)^{th}$ stage GOA circuit.

In this embodiment, the pull-up circuit 200 includes a first pull-up sub-circuit 201 and a second pull-up sub-circuit 202. The first pull-up sub-circuit 201 is connected to the control node (Qn) of the $N^{th}$ stage GOA circuit, a first clock signal end (CKn), a cascaded signal end (STn) of the $N^{th}$ stage GOA circuit, and the gate signal end (Gn) of the $N^{th}$ stage GOA circuit. The second pull-up sub-circuit 202 is connected to the control node (Qn) of the $(N+1)^{th}$ stage GOA circuit, a second clock signal end (CKn+1), a cascaded signal end (STn+1) of the $(N+1)^{th}$ stage GOA circuit, and the gate signal end (Gn+1) of the $(N+1)^{th}$ stage GOA circuit.

In this embodiment, the first clock signal end (CKn) is configured to output the first clock signal, and the second clock signal end (CKn+1) is configured to output the second clock signal.

In this embodiment, the control node (Qn) of the $N^{th}$ stage GOA circuit and the control node (Qn) of the $(N+1)^{th}$ stage GOA circuit control TFTs in the pull-up circuit 200 to turn on and turn off.

In this embodiment, the first pull-up sub-circuit 201 includes a twenty first TFT (T21) and a twenty second TFT (T22).

A gate of the twenty first TFT (T21) is connected to the control node (Qn) of the $N^{th}$ stage GOA circuit, a source of the twenty first TFT (T21) is connected to the first clock signal end (CKn), and a drain of the twenty first TFT (T21) is connected to the gate signal end (Gn) of the $N^{th}$ stage GOA circuit.

Agate of the twenty second TFT (T22) is connected to the control node (Qn) of the $N^{th}$ stage GOA circuit, a source of the twenty second TFT (T22) is connected to the first clock signal end (CKn), and a drain of the twenty second TFT (T22) is connected to the cascaded signal end (STn) of the $N^{th}$ stage GOA circuit.

The first high potential of the control node (Qn) of the $N^{th}$ stage GOA circuit turns on the twenty first TFT (T21) and the twenty second TFT (T22), the drain of the twenty first TFT (T21) is connected to the gate signal end (Gn) of the $N^{th}$ stage GOA circuit to output the gate driving signal to an $N^{th}$ scan line, and the drain of the twenty second TFT (T22) is connected to the cascaded signal end (STn) of the $N^{th}$ stage GOA circuit to output another start signal to turn on or turn off the next stage GOA circuit.

In this embodiment, the second pull-up sub-circuit 202 includes a seventy first TFT (T71) and a seventy second TFT (T72).

A gate of the seventy first TFT (T71) is connected to the control node (Qn) of the $(N+1)^{th}$ stage GOA circuit, a source of the seventy first TFT (T71) is connected to the second clock signal end (CKn+1), and a drain of the seventy first TFT (T71) is connected to the gate signal end (Gn+1) of the $(N+1)^{th}$ stage GOA circuit.

A gate of the seventy second TFT (T72) is connected to the control node (Qn) of the $(N+1)^{th}$ stage GOA circuit, a source of the seventy second TFT (T72) is connected to the second clock signal end (CKn+1), and a drain of the seventy second TFT (T72) is connected to the cascaded signal end (STn+1) of the $(N+1)^{th}$ stage GOA circuit.

The first high potential of the control node (Qn) of the $N^{th}$ stage GOA circuit turns on the seventy first TFT (T71) and the seventy second TFT (T72), the drain of the seventy first TFT (T71) is connected to the gate signal end (Gn+1) of the $(N+1)^{th}$ stage GOA circuit to output the gate driving signal to the gate signal end (Gn+1) of the $(N+1)^{th}$ stage GOA circuit, and the drain of the seventy second TFT (T72) is connected to the cascaded signal end (STn+1) of the $(N+1)^{th}$ stage GOA circuit to output another start signal to turn on or turn off another stage GOA circuit.

In this embodiment, the start signal output by the first pull-up sub-circuit 201 may be $N^{th}$ stage or $(N+k)^{th}$ stage, and the start signal output by the second pull-up sub-circuit 202 may be $(N+1)^{th}$ stage or $(N+1+k)^{th}$ stage. For example, when N=1 and k=4, the first pull-up sub-circuit 201 of a first stage GOA circuit outputs the start signal of a fifth stage GOA circuit, the first pull-up sub-circuit 201 of a second stage GOA circuit outputs the start signal of a sixth stage GOA circuit, and the transmission stage of the present application is not limited thereto.

Please refer to FIG. 1, the pull-down circuit 300 pulls the potential of the control node (Qn) of the $N^{th}$ stage GOA circuit and the potential of the control node (Qn) of the $(N+1)^{th}$ stage GOA circuit to the first DC low level, pulls the potential of the gate signal end (Gn) of the $N^{th}$ stage GOA circuit to the second DC low level, and pulls the potential of the gate signal end (Gn+1) of the $(N+1)^{th}$ stage GOA circuit to the second DC low level during the third time period.

In this embodiment, the pull-down circuit 300 is connected to the control node (Qn) of the $N^{th}$ stage GOA circuit, the control node (Qn) of the $(N+1)^{th}$ stage GOA circuit, the gate signal end (Gn) of the $N^{th}$ stage GOA circuit, the gate signal end (Gn+1) of the $(N+1)^{th}$ stage GOA circuit, a gate signal end (Gn+7) of an $(N+7)^{th}$ stage GOA circuit, a gate signal end (Gn+8) of an $(N+8)^{th}$ stage GOA circuit, a first DC low level end (VSSQ), and a second DC low level end (VSSG).

In this embodiment, the first DC low level end (VSSQ) outputs the first DC low level, and the second DC low level end (VSSG) outputs the second DC low level.

In this embodiment, the third time period starts when the gate signal end (Gn+7) of the (N+7)$^{th}$ stage GOA circuit and the gate signal end (Gn+8) of the (N+8)$^{th}$ stage GOA circuit are at high potential.

In this embodiment, the pull-down circuit 300 includes a thirty first TFT (T31), a forty first TFT (T41), and a seventy TFT (T70).

A source of the thirty first TFT (T31) is connected to the gate signal end (Gn) of the N$^{th}$ stage GOA circuit, a source of the seventy TFT (T70) is connected to the gate signal end (Gn+1) of the (N+1)$^{th}$ stage GOA circuit, and a source of the forty first TFT (T41) is connected to the control node (Qn) of the N$^{th}$ stage GOA circuit and the control node (Qn) of the (N+1)$^{th}$ stage GOA circuit.

A drain of the thirty first TFT (T31) is connected to the second DC low level end (VSSG), a drain of the seventy TFT (T70) is connected to the second DC low level end (VSSG), and a drain of the forty first TFT (T41) is connected to the first DC low level end (VSSQ).

A gate of the thirty first TFT (T31) is connected to the gate signal end (Gn+7) of the (N+7)$^{th}$ stage GOA circuit, a gate of the forty first TFT (T41) is connected to the gate signal end (Gn+8) of the (N+8)$^{th}$ stage GOA circuit, and a gate of the seventy TFT (T70) is connected to the gate signal end (Gn+8) of the (N+8)$^{th}$ stage GOA circuit.

When the gate signal end (Gn+7) of the (N+7)$^{th}$ stage GOA circuit and the gate signal end (Gn+8) of the (N+8)$^{th}$ stage GOA circuit are at high potential, the thirty first TFT (T31) and the forty first TFT (T41) are turned on, the control node (Qn) of the N$^{th}$ stage GOA circuit is pulled to the first DC low level, and the gate signal end (Gn) of the N$^{th}$ stage GOA circuit is pulled to the second DC low level.

When the gate signal end (Gn+8) of the (N+8)$^{th}$ stage GOA circuit is at high potential, the seventy TFT (T70) and the forty first TFT (T41) are turned on, the control node (Qn) of the (N+1)$^{th}$ stage GOA circuit is pulled to the first DC low level, and the gate signal end (Gn) of the (N+1)$^{th}$ stage GOA circuit is pulled to the second DC low level.

Please refer to FIG. 1, the pull-down holding circuit 400 holds the potential of the control node (Qn) of the N$^{th}$ stage GOA circuit and the potential of the control node (Qn) of the (N+1)$^{th}$ stage GOA circuit at the first DC low level, and holds the potential of the gate signal end (Gn) of the N$^{th}$ stage GOA circuit and the potential of the gate signal end (Gn+1) of the (N+1)$^{th}$ stage GOA circuit at the second DC low level during the fourth time period.

In this embodiment, the pull-down holding circuit 400 includes a first pull-down holding sub-circuit 401 and a second pull-down holding sub-circuit 402. The first pull-down holding sub-circuit 401 is connected to a high voltage signal, the control node (Qn) of the N$^{th}$ stage GOA circuit, the control node (Qn) of the (N+1)$^{th}$ stage GOA circuit, the gate signal end (Gn) of the N$^{th}$ stage GOA circuit, the first DC low level end (VSSQ), and the second DC low level end (VSSG). The second pull-down holding sub-circuit 402 is connected to a second high voltage signal, the control node (Qn) of the N$^{th}$ stage GOA circuit, the control node (Qn) of the (N+1)$^{th}$ stage GOA circuit, the gate signal end (Gn+1) of the (N+1)$^{th}$ stage GOA circuit, the first DC low level end (VSSQ), and the second DC low level end (VSSG).

In this embodiment, the first high voltage signal is output by a first high voltage signal end LC1, and the second high voltage signal is output by the second high voltage signal LC2.

In this embodiment, the first high voltage signal and the second high voltage signal are 200 times of a frame period, the first high voltage signal and the second high voltage signal are low frequency signals with 50% duty ratio, and a phase difference between the first high voltage signal and the second high voltage signal is ½.

The first pull-down holding sub-circuit 401 includes a fifty first TFT (T51), a fifty second TFT (T52), a fifty third TFT (T53), a fifty fourth TFT (T54), a forty second TFT (T42), and a thirty second TFT (T32).

A gate and a drain of the fifty first TFT (T51) receive signals from the first high voltage signal end LC1, and a source of the fifty first TFT (T51) is electrically connected to a drain of the fifty second TFT (T52) and a gate of the fifty third TFT (T53).

A gate of the fifty second TFT (T52) is electrically connected to an output end of the pull-up control circuit, and a source of the fifty second TFT (T52) is electrically connected to the first DC low level end (VSSQ).

A drain of the fifty third TFT (T53) is connected to the first high voltage signal end LC1, and a source of the fifty third TFT (T53) is electrically connected to a drain of the fifty fourth TFT (T54), a gate of the forty second TFT (T42), and a gate of the thirty second TFT (T32).

A gate of the fifty fourth TFT (T54) is electrically connected to the output end of the pull-up control circuit, and a source of the fifty fourth TFT (T54) is electrically connected to the first DC low level end (VSSQ).

A source of the forty second TFT (T42) is electrically connected to the first DC low level end (VSSQ), and a drain of the forty second TFT (T42) is electrically connected to the output end of the pull-up control circuit.

A source of the thirty second TFT (T32) is electrically connected to the second DC low level end (VSSG), and a drain of the thirty second TFT (T32) is electrically connected to the gate signal end (Gn) of the N$^{th}$ stage GOA circuit.

The second pull-down holding sub-circuit 402 includes a sixty first TFT (T61), a sixty second TFT (T62), a sixty third TFT (T63), a sixty fourth TFT (T64), a forty third TFT (T43), and a thirty third TFT (T33).

A gate and a drain of the sixty first TFT (T61) is connected to the second high voltage signal LC2, and a source of the sixty first TFT (T61) is electrically connected to a drain of the sixty second TFT (T62) and a gate of the sixty third TFT (T63).

A gate of the sixty second TFT (T62) is electrically connected to the output end of the pull-up control circuit, and a source of the sixty second TFT (T62) is electrically connected to the first DC low level end (VSSQ).

A drain of the sixty third TFT (T63) is connected to the second high voltage signal LC2, and a source of the sixty third TFT (T63) is electrically connected to a drain of the sixty fourth TFT (T64), a gate of the forty third TFT (T43), and a gate of the thirty third TFT (T33).

A gate of the sixty fourth TFT (T64) is electrically connected to the output end of the pull-up control circuit, and a source of the sixty fourth TFT (T64) is electrically connected to the first DC low level end (VSSQ).

A source of the forty third TFT (T43) is electrically connected to the first DC low level end (VSSQ), and a drain of the forty third TFT (T43) is electrically connected to the output end of the pull-up control circuit.

A source of the thirty third TFT (T33) is electrically connected to the second DC low level end (VSSG), and a drain of the thirty third TFT (T33) is electrically connected to the gate signal end (Gn+1) of the (N+1)$^{th}$ stage GOA circuit.

The present application further provides a gate driving circuit which includes the above described GOA device. The operating principle of the gate driving circuit is same as or similar to the above described GOA device, and will not be further described herein.

The present application provides the GOA device and the gate driving circuit. The GOA device includes at least two cascaded GOA circuits, an $N^{th}$ stage GOA circuit configured to output a gate driving signal to an $N^{th}$ scan line, the $N^{th}$ stage GOA circuit includes a pull-up control circuit, a bootstrap capacitor, a pull-up circuit, a pull-down circuit, and a pull-down holding circuit. The present application decreases a number of TFTs of the gate driving circuit and simplifies the structure of the gate driving circuit by multiplexing the bootstrap capacitor, the pull-down circuit, and the pull-down holding circuit.

It is understood that those of ordinary skill in the art may be equally substituted or changed in accordance with the technical scheme of this application and its invention concept, all of which shall fall within the protection of the claims attached to this application.

What is claimed is:

1. A gate driver on array (GOA) device, comprising at least two cascaded GOA circuits, an Nth stage GOA circuit configured to output a gate driving signal to an Nth scan line, the Nth stage GOA circuit comprising:
    a pull-up control circuit, receiving a start signal to pull-up a potential of a control node (Qn) of the Nth stage GOA circuit and a potential of a control node (Qn) of an (N+1)th stage GOA circuit to a first high potential to charge a bootstrap capacitor during a first time period;
    the bootstrap capacitor, holding the potential of the control node (Qn) of the Nth stage GOA circuit and the potential of the control node (Qn) of the (N+1)th stage GOA circuit at the first high potential during a second time period;
    a pull-up circuit, outputting the gate driving signal to a gate signal end (Gn) of the Nth stage GOA circuit according to a first clock signal and the first high potential applied on the control node (Qn) of the Nth stage GOA circuit, and outputting the gate driving signal to a gate signal end (Gn+1) of the (N+1)th stage GOA circuit according to a second clock signal and the first high potential applied on the control node (Qn) of the (N+1)th stage GOA circuit;
    a pull-down circuit, pulling the potential of the control node (Qn) of the Nth stage GOA circuit and the potential of the control node (Qn) of the (N+1)th stage GOA circuit to a first direct current (DC) low level, pulling a potential of the gate signal end (Gn) of the Nth stage GOA circuit to a second DC low level, and pulling a potential of the gate signal end (Gn+1) of the (N+1)th stage GOA circuit to the second DC low level during a third time period; and
    a pull-down holding circuit, holding the potential of the control node (Qn) of the Nth stage GOA circuit and the potential of the control node (Qn) of the (N+1)th stage GOA circuit at the first DC low level, and holding the potential of the gate signal end (Gn) of the Nth stage GOA circuit and the potential of the gate signal end (Gn+1) of the (N+1)th stage GOA circuit at the second DC low level during a fourth time period,
    wherein the pull-down circuit is connected to the control node (Qn) of the Nth stage GOA circuit, the control node (On) of the (N+1)th stage GOA circuit, the gate signal end (Gn) of the Nth stage GOA circuit, the gate signal end (Gn+1) of the (N+1)th stage GOA circuit, a gate signal end (Gn+7) of an (N+7)th stage GOA circuit, a gate signal end (Gn+8) of an (N+8)th stage GOA circuit, a first DC low level end (VSSQ), and a second DC low level end (VSSG),
    the first DC low level end (VSSQ) outputs the first DC low level, and the second DC low level end (VSSG) outputs the second DC low level, and
    the third time period starts when the gate signal end (Gn+7) of the (N+7)th stage GOA circuit and the gate signal end (Gn+8) of the (N+8)th stage GOA circuit are at high potential.

2. The GOA device as claimed in claim 1, wherein the pull-up control circuit is connected to a cascaded signal end (STn−6) of an (N−6)th stage GOA circuit, the control node (Qn) of the Nth stage GOA circuit, and the control node (Qn) of the (N+1)th stage GOA circuit; and
    during the first time period, the pull-up control circuit receives the start signal from the cascaded signal end (STn−6) of the (N−6)th stage GOA circuit, and receives the start signal according to the cascaded signal end (STn−6) of the (N−6)th stage GOA circuit to pull the potential of the control node (Qn) of the Nth stage GOA circuit and the potential of the control node (Qn) of the (N+1)th stage GOA circuit to the first high potential.

3. The GOA device as claimed in claim 2, wherein the pull-up control circuit comprises an eleventh thin film transistor (TFT) (T11), a gate and a source of the eleventh TFT (T11) are connected to the cascaded signal end (STn−6) of the (N−6)th stage GOA circuit, and a drain of the eleventh TFT (T11) is connected to the control node (Qn) of the Nth stage GOA circuit and the control node (Qn) of the (N+1)th stage GOA circuit.

4. The GOA device as claimed in claim 1, wherein the bootstrap capacitor is connected to the control node (Qn) of the Nth stage GOA circuit, the control node (Qn) of the (N+1)th stage GOA circuit, the gate signal end (Gn) of the Nth stage GOA circuit, the gate signal end (Gn+1) of the (N+1)th stage GOA circuit, the pull-down holding circuit, and the pull-up circuit; and
    a first end of the bootstrap capacitor is connected to the control node (Qn) of the Nth stage GOA circuit, the control node (Qn) of the (N+1)th stage GOA circuit, and the pull-up circuit, and a second end of the bootstrap capacitor is connected to the gate signal end (Gn) of the Nth stage GOA circuit, the gate signal end (Gn+1) of the (N+1)th stage GOA circuit, and the pull-down holding circuit.

5. The GOA device as claimed in claim 1, wherein the pull-up circuit comprises a first pull-up sub-circuit and a second pull-up sub-circuit;
    the first pull-up sub-circuit is connected to the control node (Qn) of the Nth stage GOA circuit, a first clock signal end (CKn), a cascaded signal end (STn) of the Nth stage GOA circuit, and the gate signal end (Gn) of the Nth stage GOA circuit;
    the second pull-up sub-circuit is connected to the control node (Qn) of the (N+1)th stage GOA circuit, a second clock signal end (CKn+1), a cascaded signal end (STn+1) of the (N+1)th stage GOA circuit, and the gate signal end (Gn+1) of the (N+1)th stage GOA circuit;
    the first clock signal end (CKn) is configured to output the first clock signal, and the second clock signal end (CKn+1) is configured to output the second clock signal; and
    the control node (Qn) of the Nth stage GOA circuit and the control node (Qn) of the (N+1)th stage GOA circuit control TFTs in the pull-up circuit to turn on and turn off.

6. The GOA device as claimed in claim 5, wherein the first pull-up sub-circuit comprises a twenty first TFT (T21) and a twenty second TFT (T22);

a gate of the twenty first TFT (T21) is connected to the control node (Qn) of the Nth stage GOA circuit, a source of the twenty first TFT (T21) is connected to the first clock signal end (CKn), and a drain of the twenty first TFT (T21) is connected to the gate signal end (Gn) of the Nth stage GOA circuit;

a gate of the twenty second TFT (T22) is connected to the control node (Qn) of the Nth stage GOA circuit, a source of the twenty second TFT (T22) is connected to the first clock signal end (CKn), and a drain of the twenty second TFT (T22) is connected to the cascaded signal end (STn) of the Nth stage GOA circuit;

the second pull-up sub-circuit comprises a seventy first TFT (T71) and a seventy second TFT (T72);

a gate of the seventy first TFT (T71) is connected to the control node (Qn) of the (N+1)th stage GOA circuit, a source of the seventy first TFT (T71) is connected to the second clock signal end (CKn+1), and a drain of the seventy first TFT (T71) is connected to the gate signal end (Gn+1) of the (N+1)th stage GOA circuit; and a gate of the seventy second TFT (T72) is connected to the control node (Qn) of the (N+1)th stage GOA circuit, a source of the seventy second TFT (T72) is connected to the second clock signal end (CKn+1), and a drain of the seventy second TFT (T72) is connected to the cascaded signal end (STn+1) of the (N+1)th stage GOA circuit.

7. The GOA device as claimed in claim 1, wherein the pull-down circuit comprises a thirty first TFT (T31), a forty first TFT (T41), and a seventy TFT (T70);

a source of the thirty first TFT (T31) is connected to the gate signal end (Gn) of the Nth stage GOA circuit, a source of the seventy TFT (T70) is connected to the gate signal end (Gn+1) of the (N+1)th stage GOA circuit, and a source of the forty first TFT (T41) is connected to the control node (Qn) of the Nth stage GOA circuit and the control node (Qn) of the (N+1)th stage GOA circuit;

a drain of the thirty first TFT (T31) is connected to the second DC low level end (VSSG), a drain of the seventy TFT (T70) is connected to the second DC low level end (VSSG), and a drain of the forty first TFT (T41) is connected to the first DC low level end (VSSQ); and a gate of the thirty first TFT (T31) is connected to the gate signal end (Gn+7) of the (N+7)th stage GOA circuit, a gate of the forty first TFT (T41) is connected to the gate signal end (Gn+8) of the (N+8)th stage GOA circuit, and a gate of the seventy TFT (T70) is connected to the gate signal end (Gn+8) of the (N+8)th stage GOA circuit.

8. The GOA device as claimed in claim 1, wherein the pull-down holding circuit comprises a first pull-down holding sub-circuit and a second pull-down holding sub-circuit;

the first pull-down holding sub-circuit is connected to a high voltage signal, the control node (Qn) of the Nth stage GOA circuit, the control node (Qn) of the (N+1)th stage GOA circuit, the gate signal end (Gn) of the Nth stage GOA circuit, a first DC low level end (VSSQ), and a second DC low level end (VSSG); and the second pull-down holding sub-circuit is connected to a second high voltage signal, the control node (Qn) of the Nth stage GOA circuit, the control node (Qn) of the (N+1)th stage GOA circuit, the gate signal end (Gn+1) of the (N+1)th stage GOA circuit, the first DC low level end (VSSQ), and the second DC low level end (VSSG).

9. The GOA device as claimed in claim 8, wherein the first high voltage signal is output by a first high voltage signal end LC1, and the second high voltage signal is output by the second high voltage signal LC2; and the first high voltage signal and the second high voltage signal are 200 times of a frame period, the first high voltage signal and the second high voltage signal are low frequency signals with 50% duty ratio, and a phase difference between the first high voltage signal and the second high voltage signal is ½.

10. A gate driving circuit comprising a gate driver on array (GOA) device;

the GOA device comprising at least two cascaded GOA circuits, an Nth stage GOA circuit configured to output a gate driving signal to an Nth scan line, wherein the Nth stage GOA circuit comprises a pull-up control circuit, a bootstrap capacitor, a pull-up circuit, a pull-down circuit, and a pull-down holding circuit;

the pull-up control circuit receives a start signal to pull-up a potential of a control node (Qn) of the Nth stage GOA circuit and a potential of a control node (Qn) of an (N+1)th stage GOA circuit to a first high potential so that the bootstrap capacitor can be charged during a first time period;

the bootstrap capacitor holds the potential of the control node (Qn) of the Nth stage GOA circuit and the potential of the control node (Qn) of the (N+1)th stage GOA circuit at the first high potential during a second time period;

the pull-up circuit outputs the gate driving signal to a gate signal end (Gn) of the Nth stage GOA circuit according to a first clock signal and the first high potential of the control node (Qn) of the Nth stage GOA circuit, and the pull-up circuit outputs the gate driving signal to a gate signal end (Gn+1) of the (N+1)th stage GOA circuit according to a second clock signal and the first high potential of the control node (Qn) of the (N+1)th stage GOA circuit;

the pull-down circuit pulls the potential of the control node (Qn) of the Nth stage GOA circuit and the potential of the control node (Qn) of the (N+1)th stage GOA circuit to a first direct current (DC) low level, pulls a potential of the gate signal end (Gn) of the Nth stage GOA circuit to a second DC low level, and pulls a potential of the gate signal end (Gn+1) of the (N+1)th stage GOA circuit to the second DC low level during a third time period; and the pull-down holding circuit holds the potential of the control node (Qn) of the Nth stage GOA circuit and the potential of the control node (Qn) of the (N+1)th stage GOA circuit at the first DC low level, and holds the potential of the gate signal end (Gn) of the Nth stage GOA circuit and the potential of the gate signal end (Gn+1) of the (N+1)th stage GOA circuit at the second DC low level during a fourth time period, wherein the pull-down circuit is connected to the control node (Qn) of the Nth stage GOA circuit, the control node (Qn) of the (N+1)th stage GOA circuit, the gate signal end (Gn) of the Nth stage GOA circuit, the gate signal end (Gn+1) of the (N+1)th stage GOA circuit, a gate signal end (Gn+7) of an (N+7)th stage GOA circuit, a gate signal end (Gn+8) of an (N+8)th stage GOA circuit, a first DC low level end (VSSQ), and a second DC low level end (VSSG), the first DC low level end (VSSQ) outputs the first DC low level, and the second DC low level end (VSSG) outputs the second DC low level, and the third time period starts when the gate signal end (Gn+7) of the (N+7)th stage GOA circuit and the gate signal end (Gn+8) of the (N+8)th stage GOA circuit are at high potential.

11. The gate driving circuit as claimed in claim 10, wherein the pull-up control circuit is connected to a cascaded signal end (STn−6) of an (N−6)th stage GOA circuit, the control node (Qn) of the Nth stage GOA circuit, and the control node (Qn) of the (N+1)th stage GOA circuit; and during the first time period, the pull-up control circuit receives the start signal from the cascaded signal end (STn−6) of the (N−6)th stage GOA circuit, and receives the start signal according to the cascaded signal end (STn−6) of the (N−6)th stage GOA circuit to pull the potential of the control node (Qn) of the Nth stage GOA circuit and the potential of the control node (Qn) of the (N+1)th stage GOA circuit to the first high potential.

12. The gate driving circuit as claimed in claim 11, wherein the pull-up control circuit comprises an eleventh thin film transistor (TFT) (T11), a gate and a source of the eleventh TFT (T11) are connected to the cascaded signal end (STn−6) of the (N−6)th stage GOA circuit, and a drain of the eleventh TFT (T11) is connected to the control node (Qn) of the Nth stage GOA circuit and the control node (Qn) of the (N+1)th stage GOA circuit.

13. The gate driving circuit as claimed in claim 10, wherein the bootstrap capacitor is connected to the control node (Qn) of the Nth stage GOA circuit, the control node (Qn) of the (N+1)th stage GOA circuit, the gate signal end (Gn) of the Nth stage GOA circuit, the gate signal end (Gn+1) of the (N+1)th stage GOA circuit, the pull-down holding circuit, and the pull-up circuit; and a first end of the bootstrap capacitor is connected to the control node (Qn) of the Nth stage GOA circuit, the control node (Qn) of the (N+1)th stage GOA circuit, and the pull-up circuit, and a second end of the bootstrap capacitor is connected to the gate signal end (Gn) of the Nth stage GOA circuit, the gate signal end (Gn+1) of the (N+1)th stage GOA circuit, and the pull-down holding circuit.

14. The gate driving circuit as claimed in claim 10, wherein the pull-up circuit comprises a first pull-up sub-circuit and a second pull-up sub-circuit;

the first pull-up sub-circuit is connected to the control node (Qn) of the Nth stage GOA circuit, a first clock signal end (CKn), a cascaded signal end (STn) of the Nth stage GOA circuit, and the gate signal end (Gn) of the Nth stage GOA circuit;

the second pull-up sub-circuit is connected to the control node (Qn) of the (N+1)th stage GOA circuit, a second clock signal end (CKn+1), a cascaded signal end (STn+1) of the (N+1)th stage GOA circuit, and the gate signal end (Gn+1) of the (N+1)th stage GOA circuit;

the first clock signal end (CKn) is configured to output the first clock signal, and the second clock signal end (CKn+1) is configured to output the second clock signal; and the control node (Qn) of the Nth stage GOA circuit and the control node (Qn) of the (N+1)th stage GOA circuit control TFTs in the pull-up circuit to turn on and turn off.

15. The gate driving circuit as claimed in claim 14, wherein the first pull-up sub-circuit comprises a twenty first TFT (T21) and a twenty second TFT (T22);

a gate of the twenty first TFT (T21) is connected to the control node (Qn) of the Nth stage GOA circuit, a source of the twenty first TFT (T21) is connected to the first clock signal end (CKn), and a drain of the twenty first TFT (T21) is connected to the gate signal end (Gn) of the Nth stage GOA circuit;

a gate of the twenty second TFT (T22) is connected to the control node (Qn) of the Nth stage GOA circuit, a source of the twenty second TFT (T22) is connected to the first clock signal end (CKn), and a drain of the twenty second TFT (T22) is connected to the cascaded signal end (STn) of the Nth stage GOA circuit;

the second pull-up sub-circuit comprises a seventy first TFT (T71) and a seventy second TFT (T72);

a gate of the seventy first TFT (T71) is connected to the control node (Qn) of the (N+1)th stage GOA circuit, a source of the seventy first TFT (T71) is connected to the second clock signal end (CKn+1), and a drain of the seventy first TFT (T71) is connected to the gate signal end (Gn+1) of the (N+1)th stage GOA circuit; and a gate of the seventy second TFT (T72) is connected to the control node (Qn) of the (N+1)th stage GOA circuit, a source of the seventy second TFT (T72) is connected to the second clock signal end (CKn+1), and a drain of the seventy second TFT (T72) is connected to the cascaded signal end (STn+1) of the (N+1)th stage GOA circuit.

16. The gate driving circuit as claimed in claim 10, wherein the pull-down circuit comprises a thirty first TFT (T31), a forty first TFT (T41), and a seventy TFT (T70);

a source of the thirty first TFT (T31) is connected to the gate signal end (Gn) of the Nth stage GOA circuit, a source of the seventy TFT (T70) is connected to the gate signal end (Gn+1) of the (N+1)th stage GOA circuit, and a source of the forty first TFT (T41) is connected to the control node (Qn) of the Nth stage GOA circuit and the control node (Qn) of the (N+1)th stage GOA circuit;

a drain of the thirty first TFT (T31) is connected to the second DC low level end (VSSG), a drain of the seventy TFT (T70) is connected to the second DC low level end (VSSG), and a drain of the forty first TFT (T41) is connected to the first DC low level end (VSSQ); and a gate of the thirty first TFT (T31) is connected to the gate signal end (Gn+7) of the (N+7)th stage GOA circuit, a gate of the forty first TFT (T41) is connected to the gate signal end (Gn+8) of the (N+8)th stage GOA circuit, and a gate of the seventy TFT (T70) is connected to the gate signal end (Gn+8) of the (N+8)th stage GOA circuit.

17. The gate driving circuit as claimed in claim 10, wherein the pull-down holding circuit comprises a first pull-down holding sub-circuit and a second pull-down holding sub-circuit;

the first pull-down holding sub-circuit is connected to a high voltage signal, the control node (Qn) of the Nth stage GOA circuit, the control node (Qn) of the (N+1)th stage GOA circuit, the gate signal end (Gn) of the Nth stage GOA circuit, a first DC low level end (VSSQ), and a second DC low level end (VSSG); and the second pull-down holding sub-circuit is connected to a second high voltage signal, the control node (Qn) of the Nth stage GOA circuit, the control node (Qn) of the (N+1)th stage GOA circuit, the gate signal end (Gn+1) of the (N+1)th stage GOA circuit, the first DC low level end (VSSQ), and the second DC low level end (VSSG).

18. The gate driving circuit as claimed in claim 17, wherein the first high voltage signal is output by a first high voltage signal end LC1, and the second high voltage signal is output by the second high voltage signal LC2; and the first high voltage signal and the second high voltage signal are 200 times of a frame period, the first high voltage signal and the second high voltage signal are low frequency signals with 50% duty ratio, and a phase difference between the first high voltage signal and the second high voltage signal is ½.

* * * * *